US011101409B2

(12) United States Patent
Schmidt et al.

(10) Patent No.: US 11,101,409 B2
(45) Date of Patent: Aug. 24, 2021

(54) PHOSPHOR CONVERTED LED

(71) Applicant: KONINKLIJKE PHILIPS N.V., Eindhoven (NL)

(72) Inventors: Peter Josef Schmidt, Aachen (DE); Walter Mayr, Aachen (DE); Volker Weiler, Aachen (DE); Hans-Helmut Bechtel, Aachen (DE)

(73) Assignee: KONINKLIJKE PHILIPS N.V.

( * ) Notice: Subject to any disclaimer, the term of this patent is extended or adjusted under 35 U.S.C. 154(b) by 0 days.

(21) Appl. No.: 15/537,299

(22) PCT Filed: Dec. 17, 2015

(86) PCT No.: PCT/EP2015/080201
§ 371 (c)(1),
(2) Date: Jun. 16, 2017

(87) PCT Pub. No.: WO2016/102295
PCT Pub. Date: Jun. 30, 2016

(65) Prior Publication Data
US 2017/0345975 A1    Nov. 30, 2017

(30) Foreign Application Priority Data
Dec. 24, 2014    (EP) .................................... 14200276

(51) Int. Cl.
*H01L 33/50*    (2010.01)
*C09K 11/08*    (2006.01)
(Continued)

(52) U.S. Cl.
CPC ........ *H01L 33/502* (2013.01); *C09K 11/0883* (2013.01); *C09K 11/59* (2013.01); *C09K 11/7734* (2013.01); *H01L 33/504* (2013.01)

(58) Field of Classification Search
CPC ........ H01J 1/63; H01J 1/64; H01J 1/66; H01J 1/72
See application file for complete search history.

(56) References Cited

U.S. PATENT DOCUMENTS 4,772,417 A    9/1988    Pappalardo et al.
6,649,946 B2    11/2003    Braune et al.
(Continued)

FOREIGN PATENT DOCUMENTS

CN    103314072 A    9/2013
EP    1669429 A    6/2006
(Continued)

OTHER PUBLICATIONS

EPO as ISA, "International Search Report and Written Opinion" dated Feb. 5, 2016 from International Application No. PCT/EP2015/080201, filed Dec. 17, 2015, 9 pages.
(Continued)

*Primary Examiner* — Zandra V Smith
*Assistant Examiner* — Andre C Stevenson

(57) ABSTRACT

The invention provides a lighting device configured to provide white lighting device light, the lighting device comprising (i) a light source, configured to provide blue light source light, and (ii) a luminescent material element, configured to absorb at least part of the blue light source light and to convert into luminescent material light, wherein the luminescent material element comprises a luminescent material which consists for at least 80 wt. % of a $M_{2-2x}Eu_{2x}Si_{5-y}Al_yO_yN_{8-y}$ phosphor, wherein M comprises one or more of Mg, Ca, Sr, Ba, with a molar ratio of (Mg+Ca+Sr)/(Ba)≤0.1, wherein x is in the range of 0.001-0.02, wherein y is in the range of ≤0.2, and wherein the white lighting device light comprises said blue light source light and said luminescent material light.

19 Claims, 1 Drawing Sheet

(51) Int. Cl.
*C09K 11/77* (2006.01)
*C09K 11/59* (2006.01)

(56) References Cited

U.S. PATENT DOCUMENTS

| | | |
|---|---|---|
| 8,821,758 B2 | 9/2014 | Kim et al. |
| 2006/0124947 A1 | 6/2006 | Mueller et al. |
| 2008/0001126 A1* | 1/2008 | Hirosaki ............... C04B 35/584 252/519.51 |
| 2010/0213822 A1* | 8/2010 | Shimooka .......... C09K 11/7774 313/503 |
| 2011/0135928 A1 | 6/2011 | Ravilisetty et al. |
| 2011/0220920 A1* | 9/2011 | Collins ................. H01L 33/504 257/88 |
| 2013/0240943 A1 | 9/2013 | Schmidt et al. |
| 2014/0218940 A1 | 8/2014 | Dai et al. |
| 2014/0264409 A1 | 9/2014 | Ashdown et al. |

FOREIGN PATENT DOCUMENTS

| | | |
|---|---|---|
| JP | 2009-263610 A | 11/2009 |
| JP | 2011-208139 A | 10/2011 |
| WO | 0140403 A1 | 6/2001 |
| WO | 2012/073177 A1 | 6/2012 |

OTHER PUBLICATIONS

European Search Report dated Aug. 4, 2015 from European Application No. 14200276.5 filed Dec. 24, 2014, 5 pages.
Communication pursuant to Article 94(3) EPC dated Nov. 10, 2017, European Application No. 15813395.9, 4 pages.
Piao, et al., "Self-propagating high temperature synthesis of yellow-emitting Ba2Si5N8:EU2+ phosphors for white light-emitting diodes", Applied Physics Letters 91, 041908, 4 pages.
Cho, et al., "Control of AlPO4-nanoparticle coating on LiCoO2 by using water or ethanol", Electrochimica Acta 50, pp. 4182-4187.
Avci, et al., "Microencapsulation of Moisture-Sensitive CaS:Eu2+ Particles with Aluminum Oxide", Journal of the Electrochemical Society, 156 (11), pp. J333-J337.
Oral Proceedings Summons dated Apr. 6, 2018, European Patent Application No. 15813395.9, 6 pages.
Y. Q. Li, et al., "Luminescence properties of red-emitting M2Si5N8:Eu2+ (M=Ca, Sr, Ba) LED conversion phosphors", Journal of Alloys and Compounds, Nov. 3, 2005, vol. 417, No. 1-2, pp. 273-279.

* cited by examiner

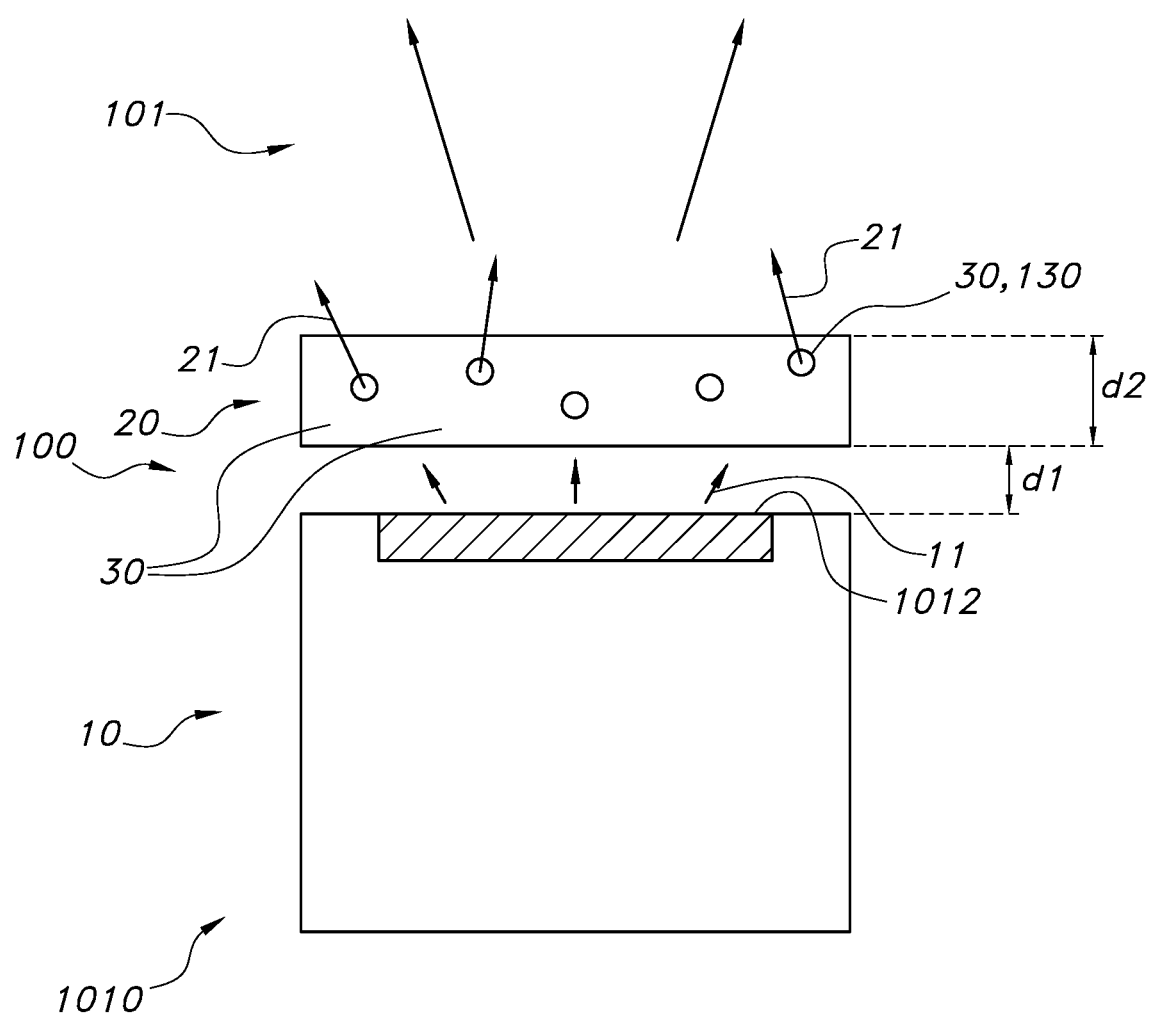

PHOSPHOR CONVERTED LED

CROSS-REFERENCE TO RELATED APPLICATIONS

The present application is a § 371 application of International Application No. PCT/EP2015/080201 filed on Dec. 17, 2015 and entitled "PHOSPHOR CONVERTED LED," which claims the benefit of European Patent Application No. 14200276.5 filed on Dec. 24, 2014. International Application No. PCT/EP2015/080201 and European Patent Application No. 14200276.5 are incorporated herein.

FIELD OF THE INVENTION

The invention relates to a lighting device and a specific luminescent material therefore. The invention also relates to a specific application of such lighting device.

BACKGROUND OF THE INVENTION

The use of red phosphors based on nitrides is known in the art. WO0140403A1, for instance, describes a light source using a yellow-to-red-emitting phosphor, wherein the phosphor converts at least partially radiation of a primary light source, characterized in that said phosphor has a host lattice of the nitridosilicate type $M_xSi_yN_z$:Eu, wherein M is at least one of an alkaline earth metal chosen from the group Ca, Sr, Ba, Zn and wherein z=2/3x+4/3y. Amongst others, this document shows barium based luminescent materials that have peak maxima over 650 nm.

SUMMARY OF THE INVENTION

Warm white phosphor-converted LEDs (pcLEDs) applied for decorative or signaling applications typically show spectral lumen equivalents in the 280-340 $lm/W_{opt}$ range. This relative low lumen equivalent may be due to application of phosphors or phosphor mixtures with relatively broad emission spectra (full width half maximum FWHM>2500 $cm^{-1}$). Further, it appears to be virtually impossible to make an efficient warm white phosphor converted LED based on a blue LED and a cerium containing garnet only. This implies that always a red emitting luminescent material has to be added. Hence, two or more luminescent materials have to be used, which may complicate production and reproducibility of the devices.

Hence, it is an aspect of the invention to provide an alternative lighting device, which preferably further at least partly obviates one or more of above-described drawbacks.

It surprisingly appears that to maximize the lumen equivalent of a warm white spectrum a LED spectrum is needed that consists of a blue emission peak at about 440-460 nm and a yellow emission peak in about the 570-580 nm range, especially the latter phosphor having an emission with a relative narrow bandwidth, such as narrower than about 2200 $cm^{-1}$.

The invention provides a warm white LED that consists of a narrow band yellow emitting phosphor material with a peak emission in about the 570-580 nm range and a spectral width FWHM in about the 2000-2100 $cm^{-1}$ range. Surprisingly, the phosphor material allows the manufacturing of warm white LEDs with lumen equivalents at around 410 lm/W at a correlated color temperature of 2700K. The increase in light output of >20% compared to prior art solutions leads to a drastic cost reduction on system level since the number of LEDs can be reduced which enables e.g. the use of smaller optics. In addition, the greatly increased efficacy minimizes the need for cooling of the LEDs and enables novel, more cost effective designs. Further, the present invention allows the use of a single phosphor for white light while also providing warm light.

Surprisingly, $Ba_2Si_5N_8$:Eu has been identified as most suitable material for high efficacy single phosphor warm white LEDs because it combines high quantum efficiency with high stability. The Eu(II) emission in $Ba_2Si_5N_8$:Eu appears to show vibration modes with low phonon frequencies. Together with a relative low activator concentration, i.e. Eu concentration, narrow band emission with FWHM=2050 $cm^{-1}$ can be obtained. Especially, the Eu concentration is <2%, more especially ≤1%. This barium nitride is known as deep red phosphor, and would in principle not be able to provide (enough) yellow light to provide a good white light. Nevertheless, it surprisingly appears that at relative low europium concentrations the band has shifted to such a low wavelength and is so narrow, that the simple combination of a blue light source and the yellow emitting barium nitride provide white light with a high efficiency and a good color rendering. This behavior is surprisingly stronger than found for other europium containing nitrides of the same type, such as the calcium analogue. Further, a combination of a blue LED and a barium nitride as described in Applied Physics Letters 91, 041908, would provide an off-white LED with a color point (duv=−0.04356 below the black body radiation locus and a very low LER=288 lm/Wopt) because of the too broad FWHM of the phosphor (FWHM=87 nm, which equals at this wavelength to about 2280 $cm^{-1}$). The below Planckian color point also leads to a large fraction of blue emission in the spectrum, with a CCT of ~3000 K, which may be too high for desired applications.

Hence, in a first aspect the invention provides a lighting device ("device") especially configured to provide (during operation) white lighting device light, the lighting device comprising (i) a light source, configured to provide blue light source light, and (ii) a luminescent material element, configured to absorb at least part of the blue light source light and to convert into luminescent material light, wherein the luminescent material element ("element") comprises a luminescent material which consists for at least 80 wt. %, especially at least 90 wt. %, of a $M_{2-2x}Eu_{2x}Si_{5-y}Al_yO_yN_{8-y}$ phosphor (herein also indicated as "barium nitride phosphor" or "BSNE" or simply "phosphor"), wherein M comprises one or more of Mg, Ca, Sr, Ba, with a molar ratio of (Mg+Ca+Sr)/(Ba)≤0.1, wherein x is in the range of 0.001-0.02, wherein y is in the range of ≤0.2 (i.e. 0≤y≤0.2), and wherein the white lighting device light comprises said blue light source light and said (yellow) luminescent material light.

The term "phosphor" may relate to a combination of different phosphors all complying with formula $M_{2-2x}Eu_{2x}Si_{5-y}Al_yO_yN_{8-y}$. The term phosphor may in an embodiment relate to a particulate phosphor and in another embodiment relate to a (mono crystalline) phosphor layer. In a specific embodiment, the term phosphor may include a self-supporting layer, such as a ceramic polycrystalline material. Likewise, the term "luminescent material" may in an embodiment relate to a particulate "luminescent material" and in another embodiment relate to a (mono crystalline) "luminescent material" layer. In a specific embodiment, the term "luminescent material" may include a self-supporting layer, such as a ceramic material. The formula $M_{2-2x}Eu_{2x}Si_{5-y}Al_yO_yN_{8-y}$ of the phosphor may also be indicated as $(M_{1-x})_2Eu_{2x}Si_{5-y}Al_yO_yN_{8-y}$ or as $(M_{1-x}Eu_x)_2Si_{5-y}Al_yO_yN_{8-y}$.

In yet a further specific embodiment, the invention provides a coated phosphor. In yet another specific embodiment, the invention provides an embedded phosphor. In the former embodiment, the coated embodiment, especially the phosphor is a particulate phosphor, with phosphor particles comprising a coating. For instance, in an embodiment the particulate (BSNE) phosphor may have a number averaged particle size in the range of 5-20 μm, such as especially 6-17 μm. However, the phosphor may also comprise a layer that is coated on one or both sided with a coating. In the latter embodiment, the phosphor may be embedded in an organic or inorganic host material. For instance, the phosphor may comprise a particulate phosphor, wherein the particles of the particulate phosphor are embedded in an organic or inorganic host, like e.g. PMMA, PET, PC, silsesquioxane, glass, etc. In a specific embodiment, the phosphor comprises an $AlPO_4$ coating. Such coating may e.g. be provided by a method described by Cho et al. (2005) in "Control of $AlPO_4$-nanoparticle coating on $LiCoO_2$ by using water or ethanol", Electrochimica Acta 50, 4182-4187. One or more alternative or additional coatings may include one or more of an $Al_2O_3$ coating and a $SiO_2$ coating. An $Al_2O_3$ coating may be prepared by e.g. atomic layer deposition (such as e.g. described in Avci, N.; Musschoot, J.; Smet, P. F.; Korthout, K.; Avci, A.; Detavernier, C.; Poelman, D. Microencapsulation of Moisture-Sensitive $CaS:Eu^{2+}$ Particles with Aluminum Oxide. J. Electrochem. Soc. 2009, 156, J333-J337). A silica coating may for e.g. be prepared via sol-gel. Such method may include stirring phosphor powder in ethanol with some tetramethoxysilane. Then, concentrated $NH_3$ solution is added. After ammonia addition, tetraethoxysilane in ethanol can be added in a closed system while stirring; optionally sonication may be applied. The suspension thus obtained can be filtered, washed and dried.

It appears that such device may provide warm white with a relative high efficiency. The color temperature can be below 3000 K, or even below 2800 K, such as in the range of 2000-2800 K. Further, the efficiency is surprisingly high. This device allows the use of a phosphor converted LED with only one phosphor while still having these advantages, which are not possible with state of the art cerium doped garnet based LEDs.

However, the term "luminescent material" does not exclude the use of other luminescent materials, as long as at least 80% wt. %, such as at least 90 wt. % includes the above mentioned barium nitride phosphor. For instance, in an embodiment the luminescent material may comprises for less than 20 wt. % of a second phosphor, such as especially selected from the group of cerium comprising garnet materials (see also below).

Especially, the luminescent material may further comprise a $M_3A_5O_{12}:Ce^{3+}$ luminescent material (as second phosphor), wherein M is selected from the group consisting of Sc, Y, Tb, Gd, and Lu, wherein A is selected from the group consisting of Al and Ga. Preferably, M at least comprises one or more of Y and Lu, and wherein A at least comprises Al. These types of materials may give highest efficiencies. In a specific embodiment, the second luminescent material comprises at least two luminescent materials of the type of $M_3A_5O_{12}:Ce^{3+}$, wherein M is selected from the group consisting of Y and Lu, wherein A is selected from the group consisting of Al, and wherein the ratio Y:Lu differ for the at least two luminescent materials. For instance, one of them may be purely based on Y, such as $Y_3Al_5O_{12}:Ce^{3+}$, and one of them may be a Y,Lu based system, such as $(Y_{0.5}Lu_{0.5})_3Al_5O_{12}:Ce^{3+}$. Embodiments of garnets especially include $M_3A_5O_{12}$ garnets, wherein M comprises at least yttrium or lutetium and wherein A comprises at least aluminum. Such garnet may be doped with cerium (Ce), with praseodymium (Pr) or a combination of cerium and praseodymium; especially however with Ce. Especially, A comprises aluminum (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet luminescent material comprises $(Y_{1-x}Lu_x)_3Al_5O_{12}:Ce$, wherein x is equal to or larger than 0 and equal to or smaller than 1. The terms ":Ce" or ":$Ce^{3+}$" (or similar terms), indicate that part of the metal ions (i.e. in the garnets: part of the "M" ions) in the luminescent material is replaced by Ce (or another luminescent species when the term(s) would indicate that, like ":Yb"). For instance, assuming $(Y_{1-x}Lu_x)_3Al_5O_{12}:Ce$, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art. Note that in these YAG examples x is e.g. used to indicate the replacement of Y by Lu.

The luminescent material element may have different shapes, compositions, etc. The term "luminescent material element" may also relate to a plurality of luminescent material elements. Especially each luminescent material element is radiationally coupled with the light source. The term "radiationally coupled" especially means that the light source and the luminescent material are associated with each other so that at least part of the radiation emitted by the light source is received by the luminescent material (and at least partly converted into luminescence). The luminescent material element is configured downstream of the light source, especially of its light emissive surface. Optionally, upstream of the luminescent material and downstream of the light source (i.e. there is a non-zero distance) and/or downstream of the luminescent material element one or more further optics may be arranged like one or more of diffusers, concentrators, collectors, optical filters, etc. Hence, especially the luminescent material element is transmissive for at least part of the light source light. In this way, downstream of the luminescent material element both light source light and luminescent material light may be perceived.

In a specific embodiment, the light source comprises a solid state light source, with a light emitting surface. Such light emitting surface of a light emitting diode is in the art also known as "die" or "LED die". Also other light sources may be applied, having a light emitting surface. Especially however, a solid state light source is applied. Especially, the light source is a light source that during operation emits (light source light) at least light at a wavelength selected from the range of 435-470 nm, especially a light source that during operation emits at least light at wavelength selected from the range of 440-470 nm, even more especially in the range of 440-465 nm, yet even more especially in the range of 445-460 nm. Hence, especially the light source is configured to generate blue light. Even more especially, the light source is configured to provide light having a dominant wavelength in the range of 435-470, yet even more especially in the range of 440-470, yet even more especially in the range of 445-460. In a specific embodiment, the light source comprises a solid state LED light source (such as a LED or laser diode). The term "light source" may also relate to a plurality of light sources, such as 2-20 (solid state) LED light sources. Hence, the term LED may also refer to a plurality of LEDs. The herein described phosphor absorbs well in the blue. Also the herein described garnet phosphors (optional second phosphor) may absorb well in the blue.

LEDs are moderately narrowband emitters with an approximately Gaussian spectral shape. Herein, the peak wavelength, $\lambda p$, is the wavelength of the peak of the spectral density curve. The center wavelength, $\lambda 0.5$ m, is the wavelength halfway between the two points with a spectral density of 50% of the peak. For a symmetrical spectrum, the peak and center wavelengths are identical. The centroid wavelength, $\lambda c$, is the mean wavelength. The peak, center, and centroid wavelengths are all derived from a plot of $S\lambda(\lambda)$ versus $\lambda$ (with S indicated the emission intensity). The dominant wavelength, $\lambda d$, is a colorimetric quantity that is described in the section on color. It is the most important description in visual illumination systems because it describes the perceived color of the LED. On the CIE color coordinate space, a straight line drawn between the point for a given color and the point for the color of the illuminant can be extrapolated out so that it intersects the perimeter of the space in two points. The point of intersection nearer to the color in question reveals the dominant wavelength of the color as the wavelength of the pure spectral color at that intersection point. The point of intersection on the opposite side of the color space gives the complementary wavelength.

In a specific embodiment, the luminescent material element is in physical contact with the light emitting surface of the solid state light source. However, in yet another embodiment, the luminescent material element may be configured at a non-zero distance from the light source, i.e. from its light emitting surface. For instance, the distance may be in the range of 0.1-100 mm, such as 1-50 mm. In the former embodiment, the luminescent material element may also have the function as heat sink; in the latter embodiment one may include light mixing in a mixing chamber with e.g. the luminescent material element as transmissive window.

The luminescent material element may be a (substantially) pure luminescent material, for instance a ceramic body, essentially comprising the above indicated barium nitride. For instance, in a specific embodiment the luminescent material element consists for at least 80 wt. %, such as at least 90 wt. %, of a $M_{2-2x}Eu_{2x}Si_{5-y}Al_yO_yN_{8-y}$. The remainder may e.g. matrix material, binder, etc. (see also below).

However, the luminescent material element may also be a coating or body comprising in addition to the luminescent material also other material, such as one or more of a binder material, a scattering material, and a matrix material. Especially, the luminescent material element may comprise a matrix, i.e. a light transmissive matrix, comprising said luminescent material. Hence, in an embodiment the luminescent material element comprises a transparent material with the luminescent material embedded therein. Especially, the luminescent material element comprises a silicone matrix with the luminescent material embedded therein. Hence, in an embodiment the luminescent material element may be configured as light guide or wave guide. The waveguide may comprises one or more materials selected from the group consisting of a transmissive organic material support, such as selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethylene terephthalate (PET), (PETG) (glycol modified polyethylene terephthalate), PDMS (polydimethylsiloxane), and COC (cyclo olefin copolymer). However, in another embodiment waveguide may comprise an inorganic material. Preferred inorganic materials are selected from the group consisting of glasses, (fused) quartz, transmissive ceramic materials, and silicones. Also hybrid materials, comprising both inorganic and organic parts may be applied.

To maximize the spectral lumen equivalent it was found necessary that the concentration of small sized alkaline earth species like Ca and Mg is kept low in $Ba_2Si_5N_8$:Eu. These elements can easily be incorporated in the host lattice and significantly broaden the emission spectrum leading to reduced luminous efficacy. Preferably the Ca concentration should be less than 0.5% relative to the total amount of alkaline earth elements and europium, more preferably less than 0.1%. Preferably the Mg concentration should be less than 0.1%, more preferably less than 0.02%. Hence, in a specific embodiment $(Mg+Ca+Sr)/(Ba) \leq 0.05$. The term "(Mg+Ca+Sr)" does not imply that all three alkaline earth ions have to be present. It may also be the case that only one or two of these are present. Of course, none of them may be present in that case $(Mg+Ca+Sr)/(Ba) \approx 0$. In many cases, all elements are present due to limited purity of starting compounds (precursor) used. A Sr precursor for example may contain a relatively high Ca concentration due to insufficient purification such as a distillation step. Hence, the formula $M_{2-2x}Eu_{2x}Si_{5-y}Al_yO_yN_{8-y}$, does as known to the person skilled in the art, not exclude the presence of other elements. As indicated above, even the pure Ba variant, i.e. M=Ba, may include some Sr and/or Ca and/or M, because of the impurity of starting materials. The same applied to the presence of europium, which even in high purity forms such as 5N may include e.g. some other lanthanide elements. The use of such formulas and the presence of impurities in compounds described by such formulas, is known to the person skilled in the art.

The term (Mg+Ca+Sr)/(Ba) refers to the ratio of the molar amounts of the respective elements. For instance, assuming $(Ba_{0.95}Sr_{0.05})_{2-2x}Eu_{2x}Si_{5-y}Al_yO_yN_{8-y}$, the ratio of (Mg+Ca+Sr)/(Ba)=0.05/0.95=0.053. As indicated above, the high Ba compounds appear to have the best optical properties, such as in term of color point, CRI, and efficiency. Hence, in yet a further specific embodiment, $(Mg+Ca+Sr)/(Ba) \leq 0.01$. Especially, M essentially consists of Ba (of which thus part is replaced by Eu, i.e.: $Ba_{2-2x}Eu_{2x}Si_{5-y}Al_yO_yN_{8-y}$, or $(Ba_{1-x}Eu_x)_2Si_{5-y}Al_yO_yN_{8-y}$.

Further, as indicated above, the Europium concentration should not be too high as then the phosphor may become too red and no good white light may be obtained. Hence, in yet a further specific embodiment $x \leq 0.01$. Especially, x is at least 0.001, such as at least 0.002. For instance, when x is 0.005, then 0.5% of M is replaced by Eu.

Further, in general the low oxygen/low aluminum variants are desired. Hence, in yet a further specific embodiment y is in the range of $\leq 0.02$. In an embodiment, y is practically 0, i.e. $M_{2-2x}Eu_{2x}Si_5N_8$. However, in other embodiment $y \geq 0.001$. There may be a slightly higher photo stability and/or thermal stability when y>0, such as $0.001 \leq y \leq 0.2$, like $0.005 \leq y \leq 0.05$. Substantially without Al—O the emission bandwidth may be more narrow and the emission may have a larger shift to the green/yellow the compared to the same phosphor but with y>0.

Further, it appears that a very efficient way to obtain (stable) phosphors, and having the desired optical properties in terms of yellowness and/or efficiency, is by starting from an europium silicon nitride material, instead of one or more of europium oxide, europium nitride and europium metal. Hence, in yet a further specific embodiment the phosphor is obtainable by heating of a mixture of $Eu_2Si_5N_8$, $BaH_2$ and $Si_3N_4$ at a temperature in the range of 1550-1800° C. under a neutral or reducing atmosphere. Similarly this applies to non-pure barium variants.

The europium comprising nitride phosphors described herein have a relatively small bandwidth. Especially, these phosphors may have an emission (of the $M_{2-2x}Eu_{2x}Si_{5-y}Al_yO_yN_{8-y}$ phosphor) having a full width half maximum (FWHM) of 2200 $cm^{-1}$ or less.

The present phosphors may amongst others be used in a decorative lighting application or in a signal lighting application. Hence, the invention also provides in a further aspect the use of the lighting device as described herein, e.g. in a decorative lighting application or a signal lighting application. The lighting device may also be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting. As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein. The invention may be most suitable for applications where warm white light with highest efficacy is needed and color rendition requirements are only low. Such applications comprise e.g. decorative lighting, signaling lighting, automotive lighting, or outdoor lighting.

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relative high blue component in the light source light.

The terms "violet light" or "violet emission" especially relates to light having a wavelength in the range of about 380-440 nm. The terms "blue light" or "blue emission" especially relates to light having a wavelength in the range of about 440-495 nm (including some violet and cyan hues). The terms "green light" or "green emission" especially relate to light having a wavelength in the range of about 495-570 nm. The terms "yellow light" or "yellow emission" especially relate to light having a wavelength in the range of about 570-590 nm. The terms "orange light" or "orange emission" especially relate to light having a wavelength in the range of about 590-620 nm. The terms "red light" or "red emission" especially relate to light having a wavelength in the range of about 620-780 nm. The term "pink light" or "pink emission" refers to light having a blue and a red component. The terms "visible", "visible light" or "visible emission" refer to light having a wavelength in the range of about 380-780 nm.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which FIG. 1 schematically depicts an embodiment of the lighting device. The drawing is not necessarily on scale.

DETAILED DESCRIPTION OF THE EMBODIMENTS

FIG. 1 schematically depicts an embodiment of the lighting device indicated with reference 100. The lighting device 100 is especially configured to provide white lighting device light 101. The lighting device 100 comprises a light source 10 which is configured to provide blue light source light 11. Further, the lighting device 100 comprises a luminescent material element 20 which is configured, especially the phosphor or luminescent material 30, to absorb at least part of the blue light source light 11 and which is configured to convert into luminescent material light 21. The luminescent material element 20 is configured downstream of the light source 10 (especially its light emitting surface, see below). Further, the luminescent material element is in this embodiment transmissive for at least part of the light source light 11. Note that the luminescent material element 20 may (thus) have waveguiding properties. The white lighting device 101 light comprises said blue light source light 11 and said luminescent material light 21. Especially, the light source 10 may comprise a solid state light source 1010 with a light emitting surface 1012, also known as die. Reference 30 indicates the luminescent material comprises by the luminescent material element. This luminescent material 30 especially provides the luminescent material light 21. Here, by way of example the luminescent material 30 is indicated as particles or regions. However, often the luminescent material 30 is homogeneously distributed over the luminescent material element. The luminescent material or phosphor 30 consists for at least 80 wt. % of a $M_{2-2x}Eu_{2x}Si_{5-y}Al_yO_yN_{8-y}$ phosphor 130, which provides the herein indicated yellow light. Note that such phosphor may have an emission band extending also in e.g. the red. Hence, reference 130 indicates the $M_{2-2x}Eu_{2x}Si_{5-y}Al_yO_yN_{8-y}$ phosphor, and reference 30 indicates the luminescent material in general, which may optionally comprise for 20 wt. % or less of a second phosphor (second phosphors).

The distance between the luminescent material 30, or here the luminescent material element 20, and the light source 10, especially its light emitting surface 1012 is indicated with d1, which is in this embodiment larger than 0 mm, but which could also be practically 0 mm, i.e. in physical contact. The thickness of the luminescent material element 20 is herein indicated with reference d2. For instance, the thickness may be in the range of a 5 μm up to 10 mm, like 10 μm u 5 mm. The thickness may depend upon the type of application, with the thinner layer thicknesses especially relevant for the non-remote or vicinity applications, and the larger layer thicknesses d2 especially relevant for remote applications.

Example 1: Phosphor Powder Preparation

It was found most suitable if the yellow emitting $Ba_2Si_5N_8$:Eu phosphor is produced by the following method: 57.7721 g (414.59 mmol) $BaH_2$, 1.1651 g (2.09 mmol) $Eu_2Si_5N_8$ (prepared by carbon reduction of a graphite, Eu(III) oxide and silicon nitride mixture at 1450° C. under nitrogen) and 46.9985 g (335.03 mmol) $Si_3N_4$ (alpha phase content >90%) are mixed by ball milling and fired at 1690° C. for 8 hrs in molybdenum crucibles under nitrogen atmosphere. After milling and washing with hydrochloric acid (5N), water and ethanol, $Ba_{1.98}Si_5N_8$:$Eu_{0.02}$ phosphor powder is obtained. XRD analysis shows that the material crystallizes in the orthorhombic $M_2Si_5N_8$ lattice type with lattice constants $a_0$=5.7803 Å, $b_0$=6.9506 Å, $c_0$=9.3855 Å. Emission measurements show a peak emission at 575 nm and FWHM=2050 cm$^{-1}$ for 440 nm excitation.

Example 2: LED Fabrication

The phosphor powder of example 1 is mixed with silicone (6 wt %) at 3000 rpm for 30 sec and dispensed into 3535 type mid power LED packages. The following table shows data obtained at 65 mA drive current at room temperature.

| sample | x | y | u' | v' | Centr. wavelength [nm] | Dom. wavelength [nm] | LE [lm/W] | flux (lm) |
|---|---|---|---|---|---|---|---|---|
| 2495 | 0.4536 | 0.3995 | 0.2635 | 0.5221 | 575.0 | 585.5 | 407 | 32.00 |
| 2496 | 0.4619 | 0.4086 | 0.2647 | 0.5269 | 577.5 | 584.7 | 413 | 32.18 |
| 2497 | 0.4588 | 0.4051 | 0.2643 | 0.5251 | 576.6 | 585.0 | 410 | 31.94 |

These data show the unexpected advantage that only a very narrow emission band of the BSNE phosphor can lead to single phosphor white emission if combined with a blue pump LED in the low CCT range.

Example 3: Emission Behavior

A plurality of phosphors was made with different Eu concentrations. The concentrations of Ba, Mg, Ca and Sr was also varied. For a number of variants, the ratio of the earth alkali cations was kept constant, and only the Eu concentration was varied. The following was found:

Peak emission for zero layer thickness* = $a+b[\text{Eu}]+c[\text{Eu}]^2+d[\text{Sr}]+e[\text{Sr}]^2+f[\text{Ca}]+g[\text{Ca}]^2$ With (values in %)

| a | b | c | d |
|---|---|---|---|
| 571.6972251 | 6.848095774 | −0.447874237 | 0.706530585 |

| e | f | g |
|---|---|---|
| −0.004088736 | −0.030072156 | 0.032754792 |

*peak position is calculated from a series of phosphor layers of varying optical thickness, the zero layer value corresponds well with the spectrum found for the LEDs Hence, ~572 nm is thus the shortest wavelength of the "258" or "BSNE" phosphors. Herebelow, optical data for infinitely thin layers obtained by extrapolation from a powder in silicone layer thickness series of two samples are discussed in more detail:

| sample | λ centroid (nm) | λ peak (nm) | λ dominant (nm) | FWHM (nm) | FWHM (cm$^{-1}$) |
|---|---|---|---|---|---|
| 2% Eu (i.e. x = 0.02) | 596.8 | 578.5 | 582 | 71.9 | 2106 |
| 1% Eu (i.e. x = 0.01) | 589.1 | 575.1 | 579 | 68.8 | 2050 |

In this table, the centroid wavelength, the peak wavelength, and the dominant wavelength are indicated, as well as the full width half maximum in nanometers and reciproke centimeters.

Best results seem obtainable with a luminescent material element with over 95% wt. % of the BSNE phosphor, having a value of x in the range of 0.005-0.015, especially 0.008-0.012, directly arranged on the LED die, and with the luminescent material having a number averaged particle size in the range of 6-17 μm, especially in the range of 10-14 μm, and especially embedded in a matrix, more especially a silicone matrix.

The invention claimed is:

1. A lighting device that in operation provides white light, the lighting device comprising
   a light source configured to provide blue source light, and
   a luminescent material layer,
   comprising a luminescent material that is at least 80 wt. % of a $M_{2-2x}Eu_{2x}Si_{5-y}Al_yO_yN_{8-y}$ phosphor, with M comprising one or more of Mg, Ca, Sr, Ba, while a molar ratio of $(Mg+Ca+Sr)/(Ba) \leq 0.1$, x is in the range of 0.001-0.01, and y is in the range of $\leq 0.2$,
   in operation, the $M_{2-2x}Eu_{2x}Si_{5-y}Al_yO_yN_{8-y}$ phosphor absorbing a portion of the blue source light and converting the portion of the blue source light that has been absorbed into a first emission that has a full width half maximum (FWHM) of 2000 cm$^{-1}$ to 2200 cm$^{-1}$ and a first peak emission wavelength in the range of 570-580 nm, the white light emitted by the lighting device comprising the first emission and another portion of the blue source light.

2. The lighting device according to claim 1, wherein $(Mg+Ca+Sr)/(Ba) \leq 0.05$.

3. The lighting device according to claim 1, wherein $(Mg+Ca+Sr)/(Ba) \leq 0.01$.

4. The lighting device according to claim 1, wherein y is in the range of $\leq 0.02$.

5. The lighting device according to claim 1, wherein the light source comprises a solid state light source with a light emitting surface.

6. The lighting device according to claim 5, wherein the blue light source has a second peak emission wavelength in the range of 435-470 nm.

7. The lighting device according to claim 5, wherein the blue light source has a second peak emission wavelength in the range of 445-460 nm.

8. The lighting device according to claim 5, wherein the luminescent material layer is in physical contact with the light emitting surface of the solid state light source.

9. The lighting device according to claim 1, wherein the luminescent material layer comprises a transparent material with the luminescent material embedded in the transparent material.

10. The lighting device according to claim 1, wherein the luminescent material element comprises a silicone matrix with the luminescent material embedded in the silicone matrix.

11. The lighting device according to claim 1, wherein the luminescent material comprises less than or equal to 20 wt. % of a second phosphor.

12. The lighting device according to claim 1, wherein the second phosphor is a cerium comprising garnet.

13. The lighting device according to claim 1, wherein the white light emitted by the lighting device consists of the first emission mixed with the another portion of the blue source light.

14. The lighting device according to claim 1, wherein the white light emitted by the lighting device has a color temperature below 2800 K.

15. The lighting device according to claim 1, wherein the luminescent material comprises at least 95 wt. % of the $M_{2-2x}Eu_{2x}Si_{5-y}Al_yO_yN_{8-y}$ phosphor.

16. The lighting device according to claim 1, wherein the lighting device outputs the white light at greater than 340 lm/W.

17. The lighting device according to claim 16, wherein the lighting device outputs the white light at 400 lm/W or higher.

18. The lighting device according to claim 1, wherein the $M_{2-2x}Eu_{2x}Si_{5-y}Al_yO_yN_{8-y}$ phosphor is $Ba_2Si_5N_8$:Eu.

19. The lighting device according to claim 1, wherein y in the range of $0 \leq y \leq 0.2$.

* * * * *